(12) United States Patent
Lee et al.

(10) Patent No.: US 12,238,977 B2
(45) Date of Patent: Feb. 25, 2025

(54) DISPLAY APPARATUS

(71) Applicant: Samsung Display Co., LTD., Yongin-si (KR)

(72) Inventors: Jinyong Lee, Yongin-si (KR); Jinho Ju, Yongin-si (KR); Kwangwoo Park, Yongin-si (KR); Yunjong Yeo, Yongin-si (KR); Wooseok Jeon, Yongin-si (KR); Chaungi Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 110 days.

(21) Appl. No.: 17/189,262

(22) Filed: Mar. 2, 2021

(65) Prior Publication Data
US 2022/0005899 A1 Jan. 6, 2022

(30) Foreign Application Priority Data
Jul. 2, 2020 (KR) .......................... 10-2020-0081671

(51) Int. Cl.
*H10K 59/124* (2023.01)
*H10K 59/131* (2023.01)

(52) U.S. Cl.
CPC ......... *H10K 59/124* (2023.02); *H10K 59/131* (2023.02)

(58) Field of Classification Search
CPC .......................... H01L 27/1248; H10K 59/124; H10K 59/131; G02F 2201/503
See application file for complete search history.

(56) References Cited

U.S. PATENT DOCUMENTS

| | | |
|---|---|---|
| 7,521,722 B2 | 4/2009 | Yamazaki et al. |
| 8,629,960 B2 | 1/2014 | Moriwaki |
| 10,497,760 B2 | 12/2019 | Yeo |
| 10,978,675 B2 | 4/2021 | Lee et al. |
| 11,011,593 B2 | 5/2021 | Kishimoto |
| 2003/0189210 A1 | 10/2003 | Yamazaki et al. |
| 2005/0116231 A1 | 6/2005 | Kang et al. |
| 2005/0260804 A1 | 11/2005 | Kang et al. |
| 2013/0126915 A1 | 5/2013 | Chan et al. |
| 2015/0014636 A1* | 1/2015 | Kang .................... H10K 50/844 438/26 |
| 2015/0194631 A1 | 7/2015 | Yamazaki et al. |
| 2017/0365814 A1* | 12/2017 | Kim .................... H10K 50/8445 |
| 2018/0076416 A1* | 3/2018 | Cho ....................... H10K 59/131 |

(Continued)

FOREIGN PATENT DOCUMENTS

| | | |
|---|---|---|
| EP | 2346020 | 7/2011 |
| EP | 3534402 | 9/2019 |

(Continued)

*Primary Examiner* — Vongsavanh Sengdara
(74) *Attorney, Agent, or Firm* — KILE PARK REED & HOUTTEMAN PLLC

(57) ABSTRACT

A display apparatus including a substrate having a display area, a plurality of pixel circuits arranged in the display area, each of the pixel circuits including a thin-film transistor, a plurality of display elements respectively connected to the pixel circuits, and a composite layer disposed between the pixel circuits and the display elements, the composite layer including a first inorganic insulating layer, a first organic insulating layer, and a second inorganic insulating layer, which are sequentially stacked.

19 Claims, 14 Drawing Sheets

(56) References Cited

U.S. PATENT DOCUMENTS

| | | | | |
|---|---|---|---|---|
| 2018/0284934 A1* | 10/2018 | Wu | ................... | G02F 1/133514 |
| 2019/0148476 A1* | 5/2019 | Park | .................... | G09G 3/3291 |
| | | | | 257/40 |
| 2019/0198320 A1* | 6/2019 | Wells | ................ | H01L 29/40117 |
| 2020/0127070 A1* | 4/2020 | Tang | ................ | H10K 59/80522 |
| 2021/0124220 A1* | 4/2021 | Hirata | ................... | G06F 3/0443 |
| 2021/0225973 A1 | 7/2021 | Kishimoto | | |
| 2022/0415997 A1* | 12/2022 | Okabe | ....................... | G09F 9/30 |

FOREIGN PATENT DOCUMENTS

| | | |
|---|---|---|
| JP | 4521295 | 12/2005 |
| KR | 10-0721941 | 1/2007 |
| KR | 10-2010-0061420 | 6/2010 |
| KR | 10-2019-0055868 | 5/2019 |
| KR | 10-2019-0078746 | 7/2019 |
| WO | 2019186806 | 10/2019 |

\* cited by examiner

DISPLAY APPARATUS

CROSS-REFERENCE TO RELATED APPLICATION

This application claims priority from and the benefit of Korean Patent Application No. 10-2020-0081671, filed on Jul. 2, 2020, which is hereby incorporated by reference for all purposes as if fully set forth herein.

BACKGROUND

Field

Embodiments of the invention relate generally to a display apparatus.

Discussion of the Background

Generally, a display apparatus includes a display element, and electronic devices configured to control electrical signals to be applied to the display element. The electronic devices include a thin-film transistor (TFT), a storage capacitor, and a plurality of wirings.

Recently, the usage of display apparatuses has diversified. Also, display apparatuses have become thinner and lighter, and thus, the uses of display apparatuses have expanded. As display apparatuses are used in various ways, various methods of designing the shape of display apparatuses are increasing.

The above information disclosed in this Background section is only for understanding of the background of the inventive concepts, and, therefore, it may contain information that does not constitute prior art.

SUMMARY

Display devices constructed according to embodiments of the invention are capable of improving robustness and flexibility against external impacts.

Additional features of the inventive concepts will be set forth in the description which follows, and in part will be apparent from the description, or may be learned by practice of the inventive concepts.

A display apparatus according to an embodiment includes a substrate having a display area, a plurality of pixel circuits arranged in the display area, each of the pixel circuits including a thin-film transistor, a plurality of display elements respectively connected to the pixel circuits, and a composite layer disposed between the pixel circuits and the display elements, the composite layer comprising a first inorganic insulating layer, a first organic insulating layer, and a second inorganic insulating layer, which are sequentially stacked.

A thickness of each of the first inorganic insulating layer and the second inorganic insulating layer may be in a range of about 1,000 Å to about 3,000 Å, and a thickness of the first organic insulating layer may be in a range of about 10,000 Å to about 20,000 Å.

A strength of each of the first inorganic insulating layer and the second inorganic insulating layer may be in a range of about 80 GPa to about 200 GPa, and a strength of the first organic insulating layer may be in a range of about 1 GPa to about 10 GPa.

The composite layer may further include a lower organic insulating layer disposed between the pixel circuit and the first inorganic insulating layer.

The composite layer may further include an upper organic insulating layer disposed between the second inorganic insulating layer and the display elements.

The composite layer may further include a second organic insulating layer and a third inorganic insulating layer, which are sequentially stacked.

The display apparatus may further include an inorganic material layer disposed in the display area and including an opening or a groove in an area between the pixel circuits, and an organic material layer filling the opening or the groove.

The opening or the groove may surround each of the pixel circuits.

The opening or the groove may surround at least a portion of the pixel circuits.

The display apparatus may further include an inorganic material layer disposed provided in the display area and including an opening or a groove in an area between the pixel circuits, and an organic interlayer insulating layer disposed on substantially the entire display area and filling the opening or the groove.

A display apparatus according to another embodiment includes a substrate including a display area and a peripheral area outside the display area, a circuit layer arranged in the display area of the substrate, the circuit layer including a first pixel circuit and a second pixel circuit, a display element layer arranged on the circuit layer, the display element layer including a first display element connected to the first pixel circuit and a second display element connected to the second pixel circuit, and a composite layer disposed between the circuit layer and the display element layer, the composite layer including a first inorganic insulating layer, a first organic insulating layer, and a second inorganic insulating layer, in which the circuit layer further includes an inorganic material layer having an opening or a groove in an area between the first pixel circuit and the second pixel circuit.

The first organic insulating layer may be disposed between the first inorganic insulating layer and the second inorganic insulating layer.

The display apparatus may further include an organic material layer filling the opening or the groove.

The display apparatus may further include a connection line arranged on the organic material layer to overlap the opening or the groove, in which the connection line may extend to an upper surface of the inorganic material layer.

The display apparatus may further include an organic interlayer insulating layer disposed over substantially the entire display area and filling the opening or the groove.

The opening or the groove may surround each of the first pixel circuit and the second pixel circuit in a plan view.

The opening or the groove may surround at least the first pixel circuit and the second pixel circuit together.

The composite layer may further include an additional organic insulating layer.

A thickness of each of the first inorganic insulating layer and the second inorganic insulating layer may be in a range of about 1,000 Å to about 3,000 Å, and a thickness of the first organic insulating layer may be in a range of about 10,000 Å to about 20,000 Å.

A strength of each of the first inorganic insulating layer and the second inorganic insulating layer may be in a range of about 80 GPa to about 200 GPa, and a strength of the first organic insulating layer may be in a range of about 1 GPa to about 10 GPa.

It is to be understood that both the foregoing general description and the following detailed description are and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
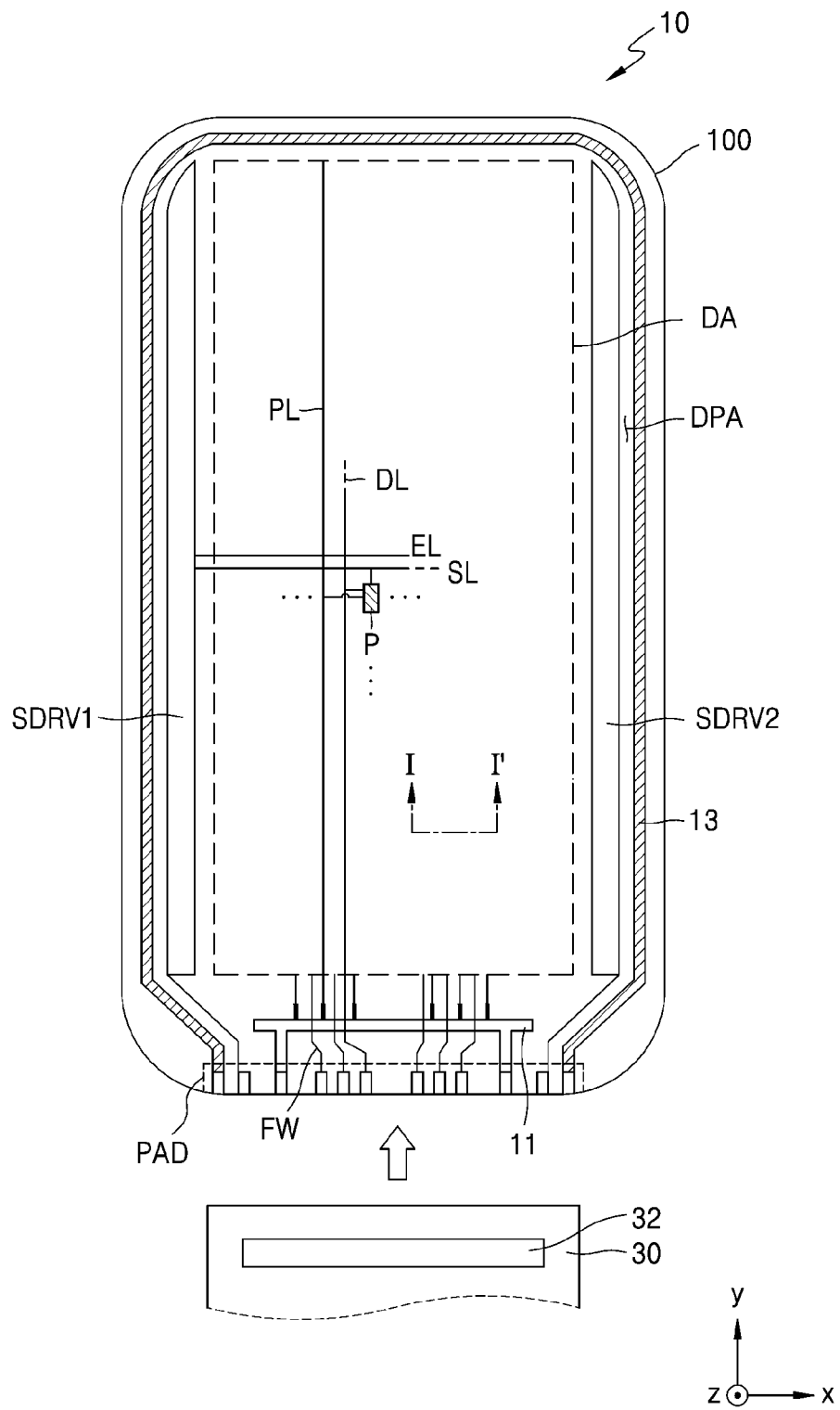
FIG. 1 is a schematic plan view of a display apparatus according to an embodiment

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic plan view of a display apparatus 10 according to an embodiment.

Referring to FIG. 1, various elements forming the display apparatus 10 are arranged on a substrate 100. The substrate 100 may include a display area DA and a peripheral area DPA surrounding the display area DA.

Pixels P are arranged in the display area DA of the substrate 100. The pixels P may each be implemented as a display element, such as an organic light-emitting diode (OLED). The pixels P may each emit, for example, red light, green light, blue light, or white light. The display area DA may be covered with a sealing member so as to be protected from external air or moisture.

Pixel circuits for driving the pixels P may be electrically connected to external circuits arranged in the peripheral area DPA. A first scan driving circuit SDRV1, a second scan driving circuit SDRV2, a terminal PAD, a driving voltage supply line 11, and a common voltage supply line 13 may be arranged in the peripheral area DPA.

The first scan driving circuit SDRV1 may apply a scan signal to each of the pixel circuits for driving the pixels P via a scan line SL. In addition, the first scan driving circuit SDRV1 may apply an emission control signal to each of the pixel circuits via an emission control line EL. The second scan driving circuit SDRV2 may be opposite to the first scan driving circuit SDRV1 with the display area DA therebetween. The second scan driving circuit SDRV2 may be substantially parallel to the first scan driving circuit SDRV1. Some pixel circuits of the pixels P may be electrically connected to the first scan driving circuit SDRV1, and the remaining ones thereof may be electrically connected to the second scan driving circuit SDRV2. In some embodiments, the second scan driving circuit SDRV2 may be omitted.

The terminal PAD may be arranged at one side of the substrate 100. The terminal PAD may be exposed without being covered with an insulating layer and be electrically connected to a display circuit board 30. A display driver 32 may be arranged on the display circuit board 30.

The display driver 32 may generate a control signal to be transmitted to the first scan driving circuit SDRV1 and the second scan driving circuit SDRV2. The display driver 32 may generate a data signal and transmit the generated data signal to the pixel circuits of the pixels P via a fan-out wiring FW and a data line DL connected to the fan-out wiring FW.

The display driver 32 may supply a driving voltage ELVDD to the driving voltage supply line 11 and may supply a common voltage ELVSS to the common voltage supply line 13. The driving voltage ELVDD may be applied to the pixel circuits of the pixels P via a driving voltage line PL connected to the driving voltage supply line 11, and the common voltage ELVSS may be applied to an opposite electrode of the display element connected to the common voltage supply line 13.

The driving voltage supply line 11 may extend from the lower side of the display area DA in the x-direction. The common voltage supply line 13 may partially surround the display area DA while having one side of the display area DA opened.

Figure 2A:
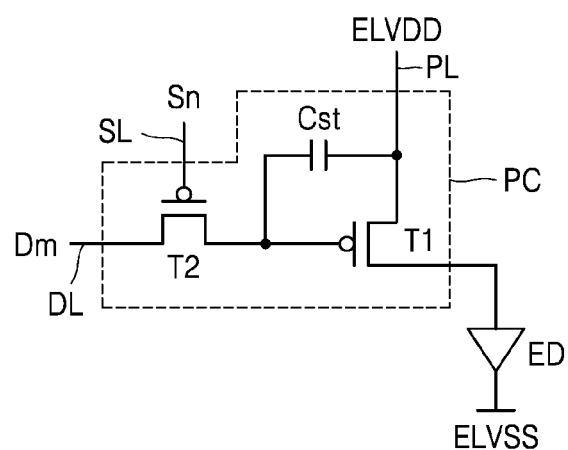
FIGS. 2A and 2B are equivalent circuit diagrams of pixel circuits that drive a pixel, according to embodiments.
Figure 2B:
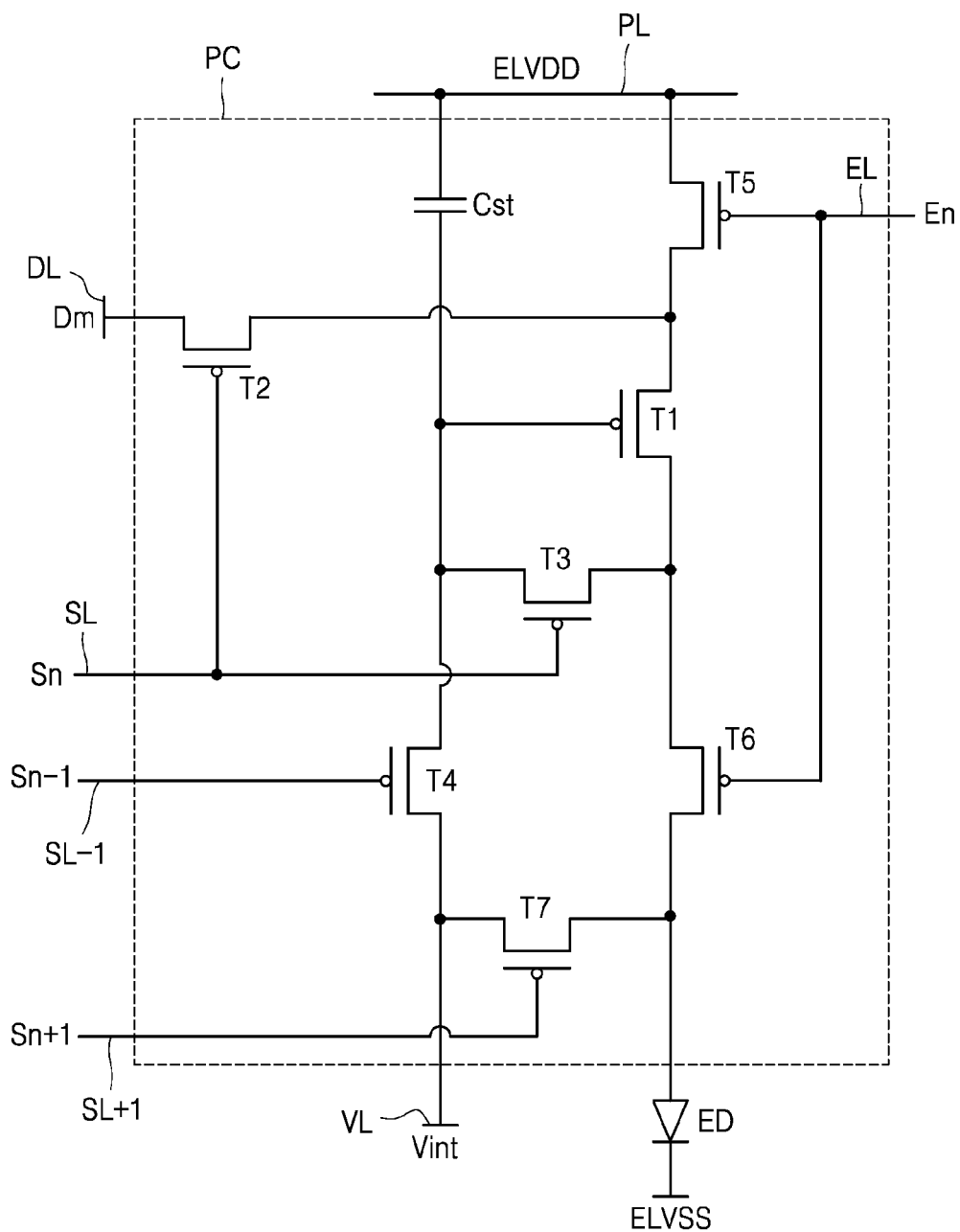

FIGS. 2A and 2B are equivalent circuit diagrams of pixel circuits PC for driving a pixel P according to embodiments.

Referring to FIG. 2A, the pixel circuit PC may be connected to a display element ED to implement light emission of pixels. The pixel circuit PC includes a driving thin-film transistor T1, a switching thin-film transistor T2, and a storage capacitor Cst. The switching thin-film transistor T2 is connected to a scan line SL and a data line DL, and is configured to transmit, to the driving thin-film transistor T1, a data signal Dm input via the data line DL according to a scan signal Sn input via the scan line SL.

The storage capacitor Cst is connected to the switching thin-film transistor T2 and the driving voltage line PL, and is configured to store a voltage corresponding to a difference between a voltage received from the switching thin-film transistor T2 and a driving voltage ELVDD supplied to the driving voltage line PL.

The driving thin-film transistor T1 may be connected to the driving voltage line PL and the storage capacitor Cst, and may be configured to control a driving current flowing from the driving voltage line PL to the display element ED according to a voltage value stored in the storage capacitor Cst. The display element ED may emit light having a certain luminance according to the driving current.

FIG. 2A illustrates the pixel circuit PC including two thin-film transistors and one storage capacitor, but the inventive concepts are not limited thereto.

Referring to FIG. 2B, the pixel circuit PC may include a driving thin-film transistor T1, a switching thin-film transistor T2, a compensating thin-film transistor T3, a first initializing thin-film transistor T4, an operation control thin-film transistor T5, an emission control thin-film transistor T6, and a second initializing thin-film transistor T7.

Although FIG. 2B illustrates a pixel circuit PC including signal lines SL, SL−1, SL+1, EL, and DL, an initializing voltage line VL, and a driving voltage line PL are provided for each pixel circuit PC, the inventive concepts are not limited thereto. In another embodiment, at least one of the signal lines, namely, the scan line SL, the previous scan line SL−1, the next scan line SL+1, the emission control line EL, and the data line DL, and/or the initializing voltage line VL may be shared with neighboring pixel circuits.

A drain electrode of the driving thin-film transistor T1 may be electrically connected to the display element ED via the emission control thin-film transistor T6. The driving thin-film transistor T1 is configured to receive a data signal Dm and supply a driving current to the display element ED according to a switching operation of the switching thin-film transistor T2.

A gate electrode of the switching thin-film transistor T2 is connected to the scan line Sn, and a source electrode of the switching thin-film transistor T2 is connected to the data line DL. A drain electrode of the switching thin-film transistor T2 may be connected to a source electrode of the driving thin-film transistor T1 and connected to the driving voltage line PL via the operation control thin-film transistor T5.

The switching thin-film transistor T2 is turned on according to a scan signal Sn received via the scan line SL and performs a switching operation of transmitting the data signal Dm received from the data line DL to the source electrode of the driving thin-film transistor T1.

A gate electrode of the compensating thin-film transistor T3 may be connected to the scan line SL. A source electrode of the compensating thin-film transistor T3 may be connected to the drain electrode of the driving thin-film transistor T1 and connected to a pixel electrode of the display element ED via the emission control thin-film transistor T6. A drain electrode of the compensating thin-film transistor T3 may be connected to any one electrode of the storage capacitor Cst, a source electrode of the first initializing thin-film transistor T4, and a gate electrode of the driving thin-film transistor T1. The compensating thin-film transistor T3 is turned on according to the scan signal Sn received via the scan line SL, and connects the gate electrode and the drain electrode of the driving thin-film transistor T1 to each other to provide diode-connection of the driving thin-film transistor T1.

A gate electrode of the first initializing thin-film transistor T4 may be connected to a previous scan line SL−1. A drain electrode of the first initializing thin-film transistor T4 may be connected to the initializing voltage line VL. The source electrode of the first initializing thin-film transistor T4 may be connected to any one electrode of the storage capacitor Cst, the drain electrode of the compensating thin-film transistor T3, and the gate electrode of the driving thin-film transistor T1. The first initializing thin-film transistor T4 may be turned on according to a previous scan signal Sn−1 received via the previous scan line SL−1 and performs an initializing operation of transmitting an initializing voltage Vint to the gate electrode of the driving thin-film transistor T1 so as to initialize the voltage of the gate electrode of the driving thin-film transistor T1.

A gate electrode of the operation control thin-film transistor T5 may be connected to the emission control line EL. A source electrode of the operation control thin-film transistor T5 may be connected to the driving voltage line PL. A drain electrode of the operation control thin-film transistor T5 is connected to the source electrode of the driving thin-film transistor T1 and the drain electrode of the switching thin-film transistor T2.

A gate electrode of the emission control thin-film transistor T6 may be connected to the emission control line EL. A source electrode of the emission control thin-film transistor T6 may be connected to the drain electrode of the driving thin-film transistor T1 and the source electrode of the compensating thin-film transistor T3. A drain electrode of the emission control thin-film transistor T6 may be electrically connected to the pixel electrode of the display element ED. The operation control thin-film transistor T5 and the emission control thin-film transistor T6 are simultaneously turned on according to an emission control signal En received via the emission control line EL, and transmits the driving voltage ELVDD to the display element ED such that the driving current flows through the display element ED.

A gate electrode of the second initializing thin-film transistor T7 may be connected to a next scan line SL+1. A source electrode of the second initializing thin-film transistor T7 may be connected to the pixel electrode of the display element ED. A drain electrode of the second initializing thin-film transistor T7 may be connected to the initializing voltage line VL. The second initializing thin-film transistor T7 may be turned on according to a next scan signal Sn+1 received via the next scan line SL+1 and initializes the pixel electrode of the display element ED.

Although FIG. 2B illustrates that the first initializing thin-film transistor T4 and the second initializing thin-film transistor T7 are connected to the previous scan line SL−1 and the next scan line SL+1, respectively, the inventive concepts are not limited thereto. In another embodiment, each of the first initializing thin-film transistor T4 and the second initializing thin-film transistor T7 may be connected to the previous scan line SL−1 and may be driven according to a previous scan signal Sn−1.

The other electrode of the storage capacitor Cst may be connected to the driving voltage line PL. Any one electrode of the storage capacitor Cst may be connected to the gate electrode of the driving thin-film transistor T1, the drain electrode of the compensating thin-film transistor T3, and the source electrode of the first initializing thin-film transistor T4.

An opposite electrode (e.g., a cathode) of the display element ED receives a common voltage ELVSS. The display element ED receives a driving current from the driving thin-film transistor T1 and emits light.

The inventive concepts are not limited to a particular number and a particular circuit design of the thin-film transistors and the storage capacitors in the pixel circuit PC, and in other embodiments, the number and the circuit design of the thin-film transistors and the storage capacitors in the pixel circuit PC may be variously changed.

Figure 3:
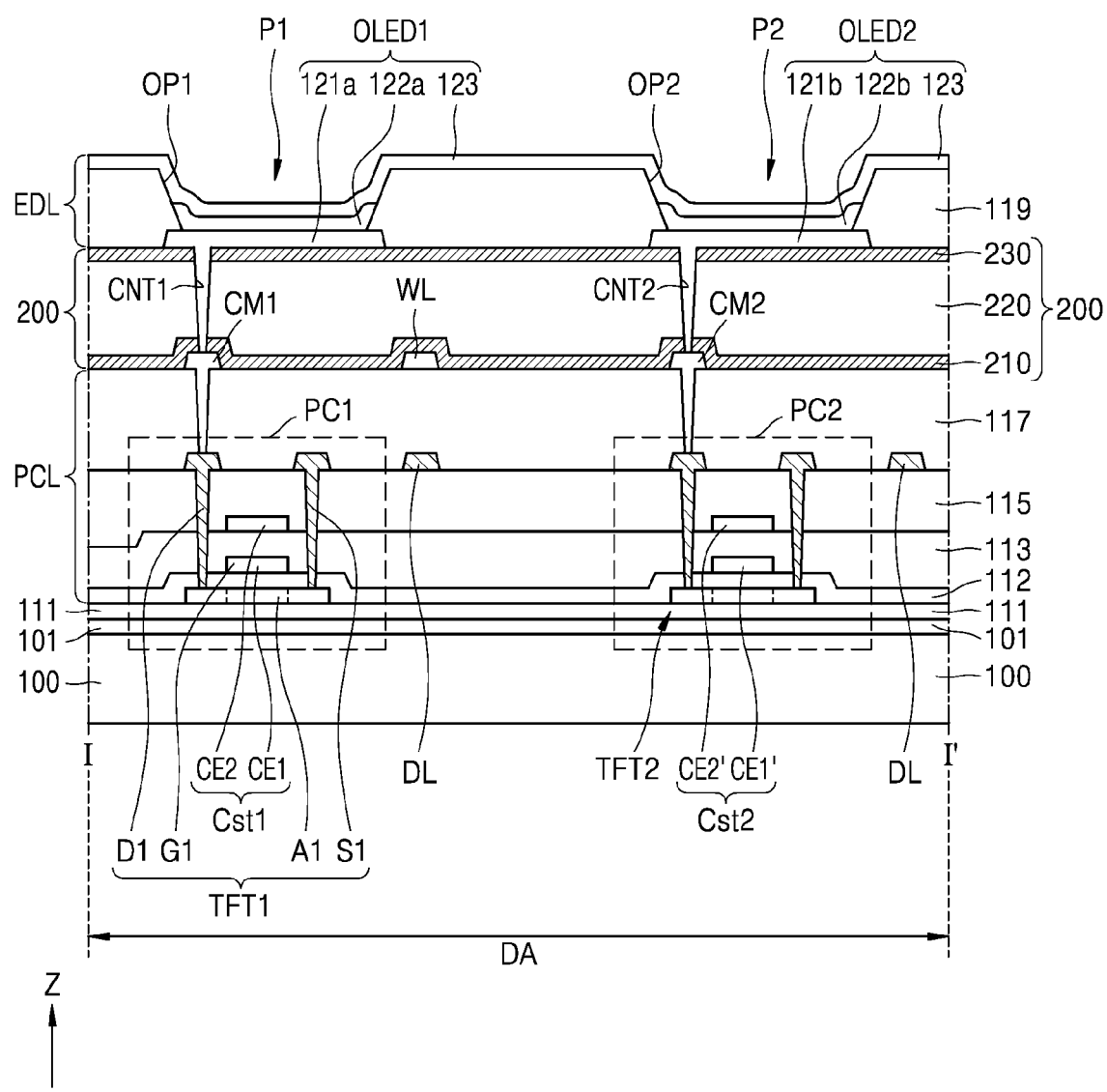
FIG. 3 is a schematic cross-sectional view of a display area of a display apparatus according to an embodiment.

FIG. 3 is a schematic cross-sectional view taken along line I-I' of FIG. 1 according to an embodiment.

Referring to FIG. 3, a plurality of pixels P1 and P2 may be arranged in the display area DA of the display apparatus 10. The pixels P1 and P2 may include a first pixel P1 and a second pixel P2. The first pixel P1 may include a first pixel circuit PC1, and a first organic light-emitting diode OLED1 that functions as a display element connected to the first pixel circuit PC1. The second pixel P2 may include a second pixel circuit PC2, and a second organic light-emitting diode OLED2 that functions as a display element connected to the second pixel circuit PC2. The first organic light-emitting diode OLED1 may include a first pixel electrode 121a, a first emission layer 122a, and an opposite electrode 123, and the second organic light-emitting diode OLED2 may include a second pixel electrode 121b, a second emission layer 122b, and the opposite electrode 123.

In the illustrated embodiment, the display element is illustrated as an organic light-emitting diode, but in another embodiment, various display elements such as an inorganic light-emitting device or a quantum dot light-emitting device may be employed as the display element.

The display apparatus 10 according to the illustrated embodiment includes a composite layer 200 between the first and second pixel circuits PC1 and PC2 and the first and second organic light-emitting diodes OLED1 and OLED2. The composite layer 200 includes a first inorganic insulating layer 210, a first organic insulating layer 220, and a second inorganic insulating layer 230, which are sequentially stacked. The composite layer 200 may be configured to significantly reduce the transmission of external impacts to the first and second pixel circuits PC1 and PC2. The composite layer 200 will be described in detail below.

Hereinafter, the elements included in the display apparatus 10 will be described. The display apparatus 10 may include a substrate 100, a barrier layer 101, a buffer layer 111, a circuit layer PCL, the composite layer 200, and a display element layer EDL, which are sequentially stacked.

The substrate 100 may include an insulating material such as glass, quartz, or a polymer resin. In some embodiments, the substrate 100 may include inorganic insulating layers and organic insulating layers, which are alternately arranged. The substrate 100 may include a flexible substrate that is bendable, foldable, or rollable.

The buffer layer 111 may be disposed on the substrate 100 and may reduce or prevent influence of a foreign material, moisture, or ambient air from below the substrate 100, and may provide a flat surface on the substrate 100. The buffer layer 111 may include an inorganic material, such as an oxide or nitride, an organic material, or an organic-inorganic composite material, and may have a single layer structure or a multilayer structure including an inorganic material or an organic material. In some embodiments, the buffer layer 111 may include silicon oxide ($SiO_x$) or silicon nitride ($SiN_x$). In some embodiments, the buffer layer 111 may include a stack of silicon oxide ($SiO_x$) or silicon nitride ($SiN_x$).

The barrier layer 101 may be disposed between the substrate 100 and the buffer layer 111 so as to block penetration of external air. The barrier layer 101 may include silicon oxide ($SiO_x$) or silicon nitride ($SiN_x$).

The circuit layer PCL may be arranged on the buffer layer 111 and may include first and second pixel circuits PC1 and PC2, a first gate insulating layer 112, a second gate insulating layer 113, an interlayer insulating layer 115, and a planarization layer 117. The first pixel circuit PC1 may include a first thin-film transistor TFT1 and a first storage capacitor Cst1. The second pixel circuit PC2 may include a second thin-film transistor TFT2 and a second storage capacitor Cst2. The configuration of the second pixel circuit PC2 is substantially the same as the configuration of the first pixel circuit PC1, and thus, the descriptions of the first pixel circuit PC1 may apply to the second pixel circuit PC2.

The first thin-film transistor TFT1 may be arranged on the buffer layer 111. The first thin-film transistor TFT1 includes a first semiconductor layer A1, a first gate electrode G1, a first source electrode S1, and a first drain electrode D1. The first thin-film transistor TFT1 may be connected to the first organic light-emitting diode OLED1 and may be configured to drive the first organic light-emitting diode OLED1.

The first semiconductor layer A1 may be arranged on the buffer layer 111 and may include polysilicon. In another embodiment, the first semiconductor layer A1 may include amorphous silicon. In still another embodiment, the first semiconductor layer A1 may include an oxide of at least one selected from indium (In), gallium (Ga), stannum (Sn), zirconium (Zr), vanadium (V), hafnium (Hf), cadmium (Cd), germanium (Ge), chromium (Cr), titanium (Ti), and zinc (Zn). The first semiconductor layer A1 may include a channel region, and a source region, and a drain region doped with impurities.

The first gate insulating layer 112 may cover the first semiconductor layer A1. The first gate insulating layer 112 may include an inorganic insulating material such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 112 may include a single layer or a multilayer including the above-described inorganic insulating material.

The first gate electrode G1 may be arranged on the first gate insulating layer 112 such that the first gate electrode G1 overlaps the first semiconductor layer A1. The first gate electrode G1 may include molybdenum (Mo), aluminum (Al), copper (Cu), titanium (Ti), or the like, and may include a single layer or a multilayer. For example, the first gate electrode G1 may include a single Mo layer.

The second gate insulating layer 113 may cover the first gate electrode G1. The second gate insulating layer 113 may include an inorganic insulating material, such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The second gate insulating layer 113 may include a single layer or a multilayer including the above-described inorganic insulating material.

A first upper electrode CE2 of the first storage capacitor Cst1 may be arranged on the second gate insulating layer 113. The first upper electrode CE2 may overlap the first gate electrode G1 arranged thereunder. The first gate electrode G1 and the first upper electrode CE2, which overlap each other with the second gate insulating layer 113 therebetween, may constitute the first storage capacitor Cst1. In this case, the first gate electrode G1 may function as a first lower electrode CE1 of the first storage capacitor Cst1.

The first upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or a multilayer including the above-described material. In some embodiments, the first upper electrode CE2 may include a single Mo layer.

The interlayer insulating layer 115 may cover the first upper electrode CE2. The interlayer insulating layer 115 may include silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The interlayer insulating layer 115 may include a single layer or a multilayer including the above-described inorganic insulating material.

In some embodiments, the interlayer insulating layer 115 may include an organic insulating material. The interlayer insulating layer 115 may include a general-purpose polymer (e.g., benzocyclobutene (BCB), polyimide, hexamethyldisiloxane (HMDSO), polymethylmethacrylate (PMMA), or polystyrene (PS)), a polymer derivative having a phenol-based group, an acrylic polymer, an imide-based polymer, an aryl ether-based polymer, an amide-based polymer, a fluorine-based polymer, a p-xylene-based polymer, or a vinyl alcohol-based polymer.

A data line DL, a first source electrode S1, and a first drain electrode D1 may be arranged on the interlayer insulating layer 115. The data line DL, the first source electrode S1, and the first drain electrode D1 may each include a conductive material including molybdenum (Mo), aluminum (Al), copper (Cu), titanium (Ti), and the like, and may each include a single layer or a multilayer including the above-described material. For example, the data line DL, the first source electrode S1, and the first drain electrode D1 may each have a multilayer structure of Ti/Al/Ti.

The planarization layer 117 may be arranged to cover the data line DL, the first source electrode S1, and the first drain electrode D1. The planarization layer 117 may provide a flat upper surface such that the elements arranged thereon are formed on the flat surface.

The planarization layer 117 may include an organic material or an inorganic material, and may have a single layer structure or a multilayer structure. The planarization layer 117 may include a general-purpose polymer (e.g., benzocyclobutene (BCB), polyimide, hexamethyldisiloxane (HMDSO), polymethylmethacrylate (PMMA), or polystyrene (PS)), a polymer derivative having a phenol-based group, an acrylic polymer, an imide-based polymer, an aryl ether-based polymer, an amide-based polymer, a fluorine-based polymer, a p-xylene-based polymer, or a vinyl alcohol-based polymer. The planarization layer 117 may include an inorganic insulating material such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). When the planarization layer 117 is formed, a layer may be formed and chemical mechanical polishing may be performed on the layer so as to provide a flat upper surface.

A first connection electrode CM1, a second connection electrode CM2, and a wiring WL may be arranged on the planarization layer 117. Due to the composite layer 200, the wiring WL may be further arranged on the planarization layer 117, which may be advantageous for high integration. The first connection electrode CM1 may be configured to connect the first pixel circuit PC1 to the first organic light-emitting diode OLED1. More particularly, the planarization layer 117 may include a via hole exposing one of the first source electrode S1 and the first drain electrode D1, and the first connection electrode CM1 may be in contact with the first source electrode S1 or the first drain electrode D1 via the via hole, such that the first connection electrode CM1 is electrically connected to the first thin-film transistor TFT1. Also, the first pixel electrode 121a of the first organic light-emitting diode OLED1 may be connected to the first connection electrode CM1. Similarly, the second connection electrode CM2 may be configured to connect the second pixel circuit PC2 to the second organic light-emitting diode OLED2.

The composite layer 200 may be arranged on the circuit layer PCL. The composite layer 200 may cover the first connection electrode CM1, the second connection electrode CM2, and the wiring WL, which are arranged on the planarization layer 117. The composite layer 200 may include the first inorganic insulating layer 210, the first organic insulating layer 220, and the second inorganic insulating layer 230, which are sequentially stacked. More particularly, the composite layer 200 may have a structure in which an organic insulating layer is sandwiched between inorganic insulating layers.

The composite layer 200 may prevent external impacts from being transmitted to the first and second pixel circuits PC1 and PC2. The composite layer 200 may be disposed between the first and second pixel circuits PC1 and PC2 and the first and second organic light-emitting diodes OLED1 and OLED2, which are the display elements, such that impacts transmitted from above the display elements are prevented from being transmitted to the first and second pixel circuits PC1 and PC2.

When only the organic insulating layer is disposed between the first and second pixel circuits PC1 and PC2 and the first and second organic light-emitting diodes OLED1 and OLED2, impacts may be absorbed to some extent due to characteristics thereof. However, large impacts may not be completely absorbed and some impacts may be transmitted to the first and second pixel circuits PC1 and PC2.

In the illustrated embodiment, the composite layer 200 includes the first inorganic insulating layer 210 and the second inorganic insulating layer 230, each having high strength, below and above the first organic insulating layer 220, respectively. In this manner, before impacts are transmitted to the lower portion of the composite layer 200, the first inorganic insulating layer 210 and the second inorganic insulating layer 230 may absorb and disperse the impacts. In this case, the first organic insulating layer 220 may provide a flat upper surface and absorb impacts.

The first inorganic insulating layer 210 and the second inorganic insulating layer 230 may each include silicon oxide ($SiO_x$), silicon nitride ($SiN_x$), and/or silicon oxynitride ($SiO_xN_y$). The first organic insulating layer 220 may include a general-purpose polymer (e.g., benzocyclobutene (BCB), polyimide, hexamethyldisiloxane (HMDSO), polymethylmethacrylate (PMMA), or polystyrene (PS)), a polymer derivative having a phenol-based group, an acrylic polymer, an imide-based polymer, an aryl ether-based polymer, an amide-based polymer, a fluorine-based polymer, a p-xylene-based polymer, or a vinyl alcohol-based polymer.

In some embodiments, the strength of each of the first inorganic insulating layer 210 and the second inorganic insulating layer 230 may be in a range of about 80 GPa to about 200 GPa, and the strength of the first organic insulating layer 220 may be in a range of about 1 GPa to about 10 GPa. In this manner, the composite layer 200 may disperse and absorb impacts.

In some embodiments, the thickness of each of the first inorganic insulating layer 210 and the second inorganic insulating layer 230 may be in a range of about 1,000 Å to about 3,000 Å, and the thickness of the first organic insulating layer 220 may be in a range of about 10,000 Å to about 20,000 Å. In this manner, the composite layer 200 may disperse and absorb impacts.

The composite layer 200 may include a first contact hole CNT1 exposing the first connection electrode CM1 and a second contact hole CNT2 exposing the second connection electrode CM2. The first organic light-emitting diode OLED1 and the second organic light-emitting diode OLED2 may be respectively connected to the first pixel circuit PC1 and the second pixel circuit PC2 via the first contact hole CNT1 and the second contact hole CNT2. The first contact hole CNT1 and the second contact hole CNT2 may be formed by stacking the first inorganic insulating layer 210, the first organic insulating layer 220, and the second inorganic insulating layer 230, and performing photoresist patterning and etching processes thereon.

A display element layer EDL is arranged on the composite layer 200. A first organic light-emitting diode OLED1 and a second organic light-emitting diode OLED2 may be arranged on the display element layer EDL.

The first pixel electrode 121a and the second pixel electrode 121b may each include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). The first pixel electrode 121a and the second pixel electrode 121b may each include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compounds thereof. For example, the first pixel electrode 121a and the second pixel electrode 121b may each have a structure in which layers including ITO, IZO, ZnO, or $In_2O_3$ are arranged above and/or below the reflective layer. In this case, the first pixel electrode 121a and the second pixel electrode 121b may each have a stack structure of ITO/Ag/ITO.

The first pixel electrode 121a may be connected to the first connection electrode CM1 via the first contact hole CNT1 defined in the composite layer 200. The second pixel electrode 121b may be connected to the second connection electrode CM2 via the second contact hole CNT2 defined in the composite layer 200.

The pixel defining layer 119 may include a first opening OP1 and a second opening OP2 respectively covering edges of the first pixel electrode 121a and the second pixel electrode 121b and exposing central portions of the first pixel electrode 121a and the second pixel electrode 121b. The first opening OP1 and the second opening OP2 define the sizes and shapes of emission areas of the first and second organic light-emitting diodes OLED1 and OLED2, that is, the pixels P1 and P2, respectively.

The pixel defining layer 119 increases a distance between the edges of the first and second pixel electrodes 121a and 121b and the opposite electrodes 123 above the first and second pixel electrodes 121a and 121b, thereby preventing arcs or the like from occurring at the edges of the first and second pixel electrodes 121a and 121b. The pixel defining layer 119 may include at least one organic insulating material such as polyimide, polyamide, an acrylic resin, benzocyclobutene, hexamethyldisiloxane (HMDSO), and a phenol resin, and may be formed by spin coating or the like.

A first emission layer 122a and a second emission layer 122b respectively formed to correspond to the first pixel electrode 121a and the second pixel electrode 121b may be arranged in the first opening OP1 and the second opening OP2 of the pixel defining layer 119, respectively. The first emission layer 122a and the second emission layer 122b may each include a high molecular weight material or a low molecular weight material, and may each emit red light, green light, blue light, or white light.

Organic functional layers may be arranged above and/or below the first emission layer 122a and the second emission layer 122b. The organic functional layers may each include a single layer or a multilayer including an organic material. The organic functional layers may include a hole injection layer (HIL), a hole transport layer (HTL), an electron transport layer (ETL), and/or an electron injection layer (EIL). The organic functional layers may be integrally formed to correspond to the first and second organic light-emitting diodes OLED1 and OLED2 arranged in the display area.

Opposite electrodes 123 are arranged on the first emission layer 122a and the second emission layer 122b. The opposite electrode 123 may include a conductive material having a low work function. For example, the opposite electrode 123 may include a (semi)transparent layer including, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the opposite electrodes 123 may each further include a layer, such as ITO, IZO, ZnO, or $In_2O_3$ on the (semi)transparent layer including the above-mentioned material. The opposite electrodes 123 may be integrally formed to correspond to the first and second organic light-emitting diodes OLED1 and OLED2 arranged in the display area.

A capping layer including an organic material may be arranged on the opposite electrodes 123. The capping layer may protect the opposite electrodes 123 and increase light extraction efficiency. The capping layer may include an organic material having a refractive index greater than that of the opposite electrode 123.

Also, a thin-film encapsulation layer may be arranged on the display element layer EDL as a sealing member. In this manner, the first and second organic light-emitting diodes OLED1 and OLED2 may be sealed by the thin-film encapsulation layer. The thin-film encapsulation layer may prevent external moisture or foreign material from penetrating into the first and second organic light-emitting diodes OLED1 and OLED2. The thin-film encapsulation layer may include at least one inorganic encapsulation layer and at least one organic encapsulation layer. In some embodiments, the thin-film encapsulation layer may include a first inorganic encapsulation layer, an organic encapsulation layer, and a second inorganic encapsulation layer, which are sequentially stacked.

The first inorganic encapsulation layer and the second inorganic encapsulation layer may each include at least one inorganic insulating material such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$), and may each be formed by chemical vapor deposition (CVD). The organic encapsulation layer may include a polymer-based material. The polymer-based material may include a silicon-based resin, an acrylic resin, an epoxy-based resin, polyimide, polyethylene, and the like.

Figure 4:
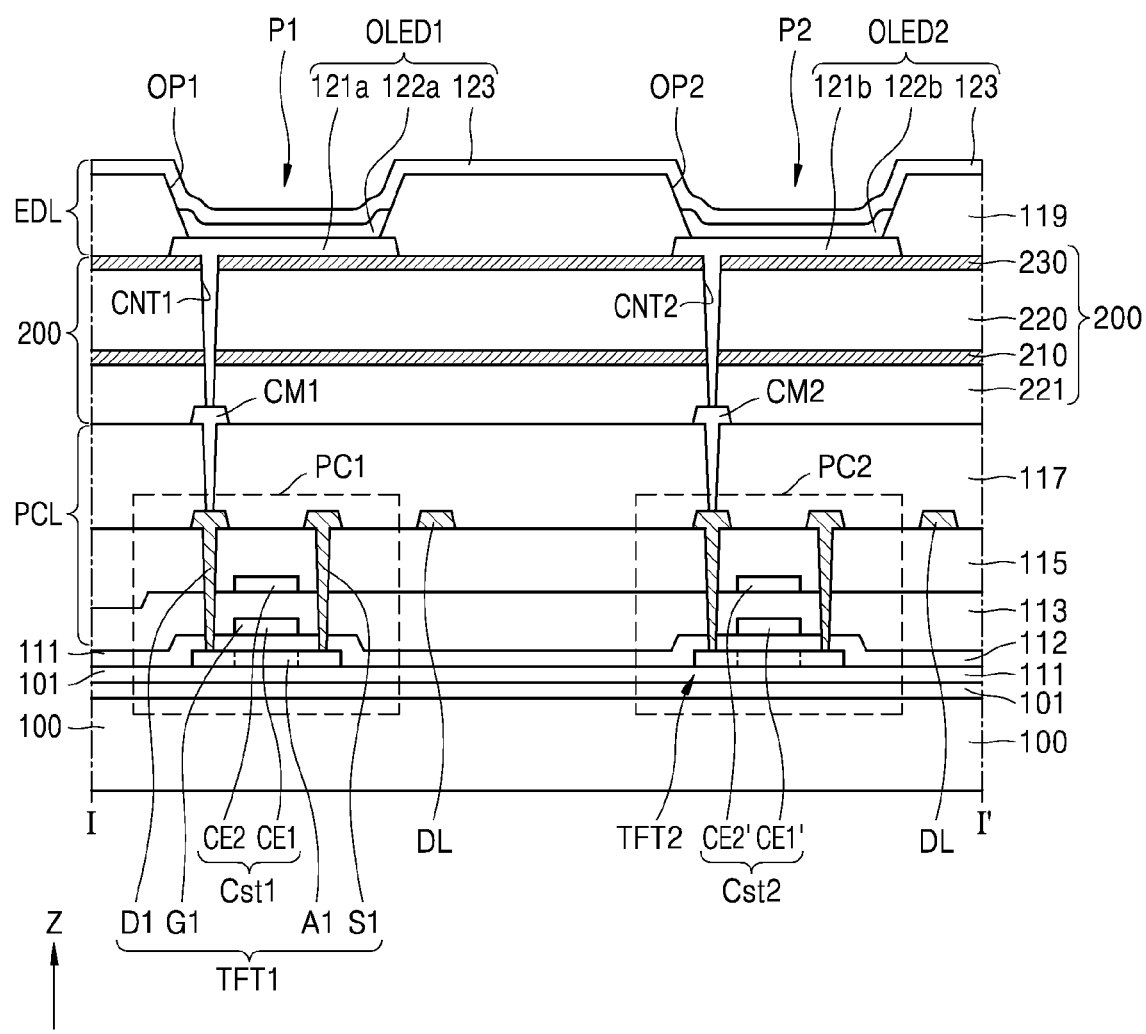
FIG. 4 is a schematic cross-sectional view of a portion of a display apparatus according to an embodiment.

FIG. 4 is a schematic cross-sectional view of a portion of a display apparatus according to an embodiment. In FIG. 4, the elements that are substantially the same as those in FIG. 3 will be given the same reference numerals.

The display apparatus according to the illustrated embodiment includes first and second pixel circuits PC1 and PC2 arranged in a display area of a substrate 100, first and second organic light-emitting diodes OLED1 and OLED2 respectively connected to the first and second pixel circuits PC1 and PC2, a composite layer 200 between the first and second pixel circuits PC1 and PC2, and the first and second organic light-emitting diodes OLED1 and OLED2. The composite layer 200 includes a first inorganic insulating layer 210, a first organic insulating layer 220, and a second inorganic insulating layer 230, which are sequentially stacked.

In the illustrated embodiment, the composite layer 200 may further include a lower organic insulating layer 221 below the first inorganic insulating layer 210. The lower organic insulating layer 221 may be arranged on a planarization layer 117 to cover connection lines CM1 and CM2. As the composite layer 200 further includes the lower organic insulating layer 221, impact absorption and flatness of the upper surface of the composite layer 200 may be improved.

The lower organic insulating layer 221 may include a general-purpose polymer (e.g., benzocyclobutene (BCB), polyimide, hexamethyldisiloxane (HMDSO), polymethylmethacrylate (PMMA), or polystyrene (PS)), a polymer derivative having a phenol-based group, an acrylic polymer, an imide-based polymer, an aryl ether-based polymer, an amide-based polymer, a fluorine-based polymer, a p-xylene-based polymer, or a vinyl alcohol-based polymer.

In some embodiments, the strength of each of the first inorganic insulating layer 210 and the second inorganic insulating layer 230 may be in a range of about 80 GPa to about 200 GPa, and the strength of each of the first organic insulating layer 220 and the lower organic insulating layer 221 may be in a range of about 1 GPa to about 10 GPa. In this manner, the composite layer 200 may disperse and absorb impacts.

In some embodiments, the thickness of each of the first inorganic insulating layer 210 and the second inorganic insulating layer 230 may be in a range of about 1,000 Å to about 3,000 Å, and the thickness of each of the first organic insulating layer 220 and the lower organic insulating layer 221 may be in a range of about 10,000 Å to about 20,000 Å. In this manner, the composite layer 200 may disperse and absorb impacts.

Figure 5:
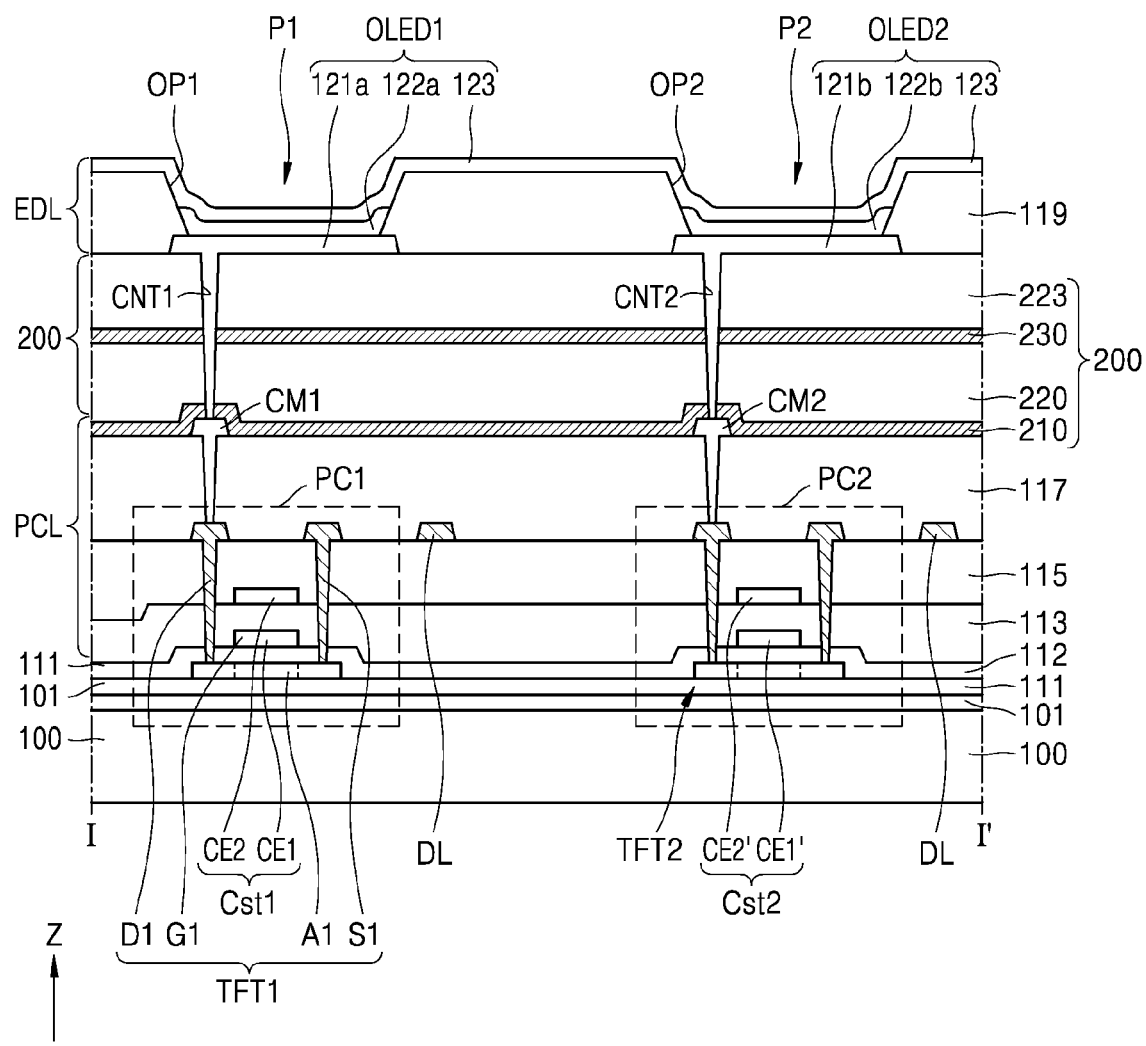
FIG. 5 is a schematic cross-sectional view of a portion of a display apparatus according to an embodiment.

FIG. 5 is a schematic cross-sectional view of a portion of a display apparatus according to an embodiment. In FIG. 5, the elements that are substantially the same as those in FIG. 3 will be given the same reference numerals.

The display apparatus according to the illustrated embodiment includes first and second pixel circuits PC1 and PC2 arranged in a display area of a substrate 100, first and second organic light-emitting diodes OLED1 and OLED2 respectively connected to the first and second pixel circuits PC1 and PC2, a composite layer 200 between the first and second pixel circuits PC1 and PC2, and the first and second organic light-emitting diodes OLED1 and OLED2. The composite layer 200 includes a first inorganic insulating layer 210, a first organic insulating layer 220, and a second inorganic insulating layer 230, which are sequentially stacked.

In the illustrated embodiment, the composite layer 200 may further include an upper organic insulating layer 223 above the second inorganic insulating layer 230. The upper organic insulating layer 223 may be disposed between the second inorganic insulating layer 230 and first and second pixel electrodes 121a and 121b of the first and second organic light-emitting diodes OLED1 and OLED2. As the composite layer 200 further includes the upper organic insulating layer 223, impact absorption and flatness of the upper surface of the composite layer 200 may be improved.

The upper organic insulating layer 223 may include a general-purpose polymer (e.g., benzocyclobutene (BCB), polyimide, hexamethyldisiloxane (HMDSO), polymethylmethacrylate (PMMA), or polystyrene (PS)), a polymer derivative having a phenol-based group, an acrylic polymer, an imide-based polymer, an aryl ether-based polymer, an amide-based polymer, a fluorine-based polymer, a p-xylene-based polymer, or a vinyl alcohol-based polymer.

In some embodiments, the strength of each of the first inorganic insulating layer 210 and the second inorganic insulating layer 230 may be in a range of about 80 GPa to about 200 GPa, and the strength of each of the first organic insulating layer 220 and the upper organic insulating layer 223 may be in a range of about 1 GPa to about 10 GPa. In this manner, the composite layer 200 may disperse and absorb impacts.

In some embodiments, the thickness of each of the first inorganic insulating layer 210 and the second inorganic insulating layer 230 may be in a range of about 1,000 Å to about 3,000 Å, and the thickness of each of the first organic insulating layer 220 and the upper organic insulating layer 223 may be in a range of about 10,000 Å to about 20,000 Å. In this manner, the composite layer 200 may disperse and absorb impacts.

Figure 6:
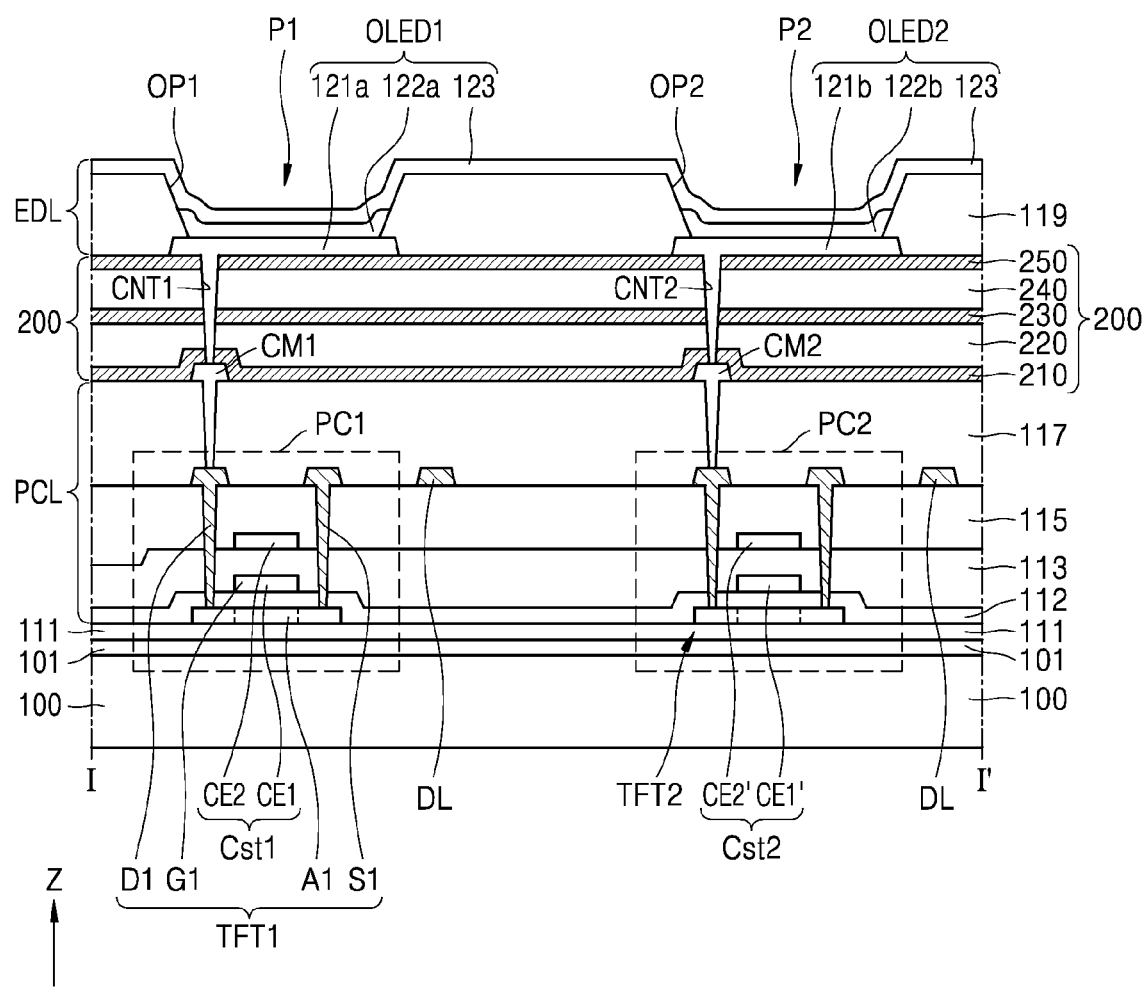
FIG. 6 is a schematic cross-sectional view of a portion of a display apparatus according to an embodiment.

FIG. 6 is a schematic cross-sectional view of a portion of a display apparatus according to an embodiment. In FIG. 6, the elements that are substantially the same as those in FIG. 3 will be given the same reference numerals.

The display apparatus according to the illustrated embodiment includes first and second pixel circuits PC1 and PC2 arranged in a display area of a substrate 100, first and second organic light-emitting diodes OLED1 and OLED2 respectively connected to the first and second pixel circuits PC1 and PC2, a composite layer 200 between the first and second pixel circuits PC1 and PC2, and the first and second organic light-emitting diodes OLED1 and OLED2.

The composite layer 200 according to the illustrated embodiment may include a first inorganic insulating layer 210, a first organic insulating layer 220, a second inorganic insulating layer 230, a second organic insulating layer 240, and a third inorganic insulating layer 250, which are sequentially stacked.

As the composite layer 200 further includes the second organic insulating layer 240 and the third inorganic insulating layer 250, impact dispersion and flatness of the upper surface of the composite layer 200 may be improved.

The second organic insulating layer 240 may include a general-purpose polymer (e.g., benzocyclobutene (BCB), polyimide, hexamethyldisiloxane (HMDSO), polymethylmethacrylate (PMMA), or polystyrene (PS)), a polymer derivative having a phenol-based group, an acrylic polymer, an imide-based polymer, an aryl ether-based polymer, an amide-based polymer, a fluorine-based polymer, a p-xylene-based polymer, or a vinyl alcohol-based polymer.

In some embodiments, the strength of each of the first inorganic insulating layer 210, the second inorganic insulating layer 230, and the third inorganic insulating layer 250 may be in a range of about 80 GPa to about 200 GPa, and the strength of each of the first organic insulating layer 220 and the second organic insulating layer 240 may be in a range of about 1 GPa to about 10 GPa. In this manner, the composite layer 200 may disperse and absorb impacts.

In some embodiments, the thickness of each of the first inorganic insulating layer 210, the second inorganic insulating layer 230, and the third inorganic insulating layer 250 may be in a range of about 1,000 Å to about 3,000 Å, and the thickness of each of the first organic insulating layer 220 and the second organic insulating layer 240 may be in a range of about 10,000 Å to about 20,000 Å. In this manner, the composite layer 200 may disperse and absorb impacts.

However, the inventive concepts are not limited thereto. The composite layer 200 in other embodiments may further include additional organic insulating layers and additional inorganic insulating layers alternately arranged one over another.

Figure 7:
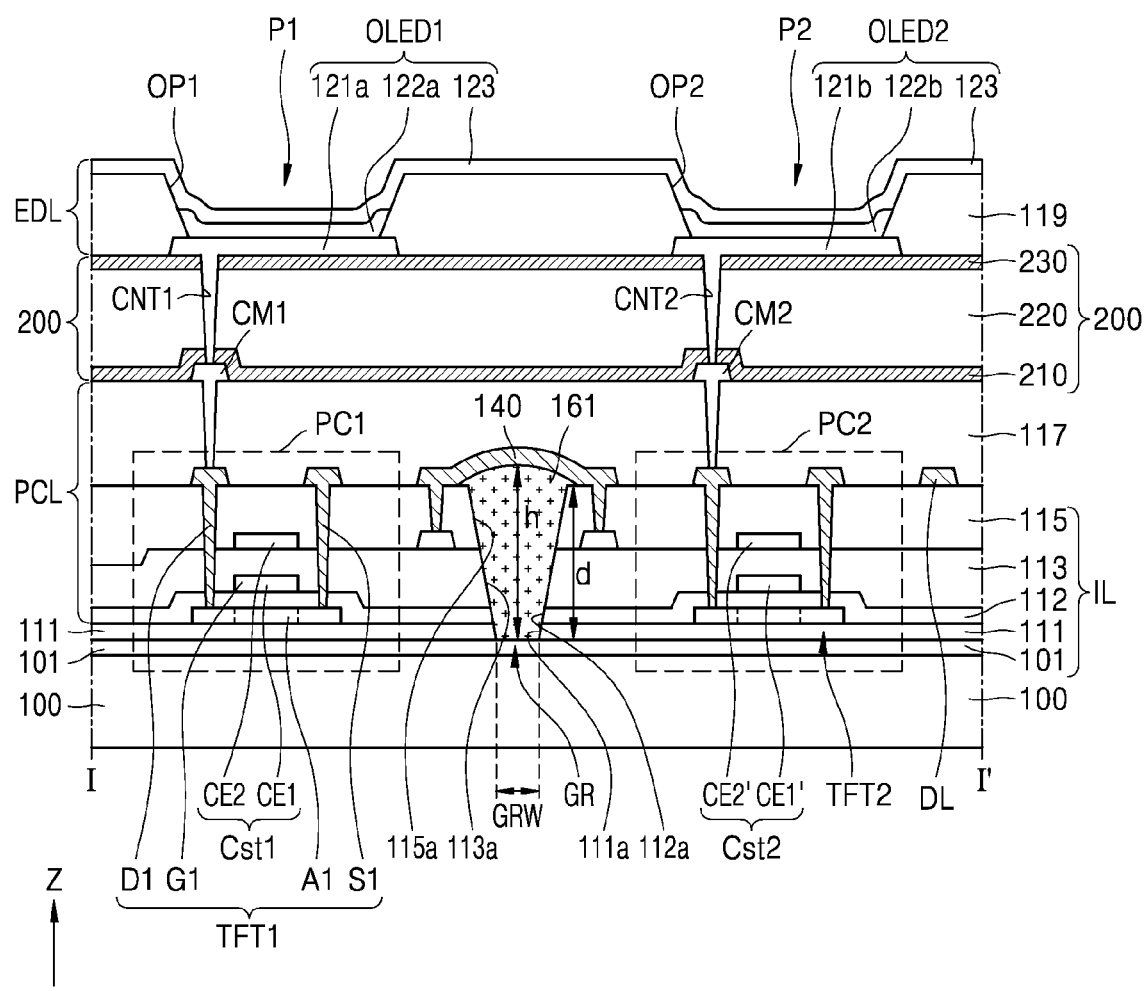
FIG. 7 is a schematic cross-sectional view of a portion of a display apparatus according to an embodiment.

FIG. 7 is a schematic cross-sectional view of a portion of a display apparatus according to an embodiment. In FIG. 7, the elements that are substantially the same as those in FIG. 3 will be given the same reference numerals.

The display apparatus according to the illustrated embodiment includes first and second pixel circuits PC1 and PC2 arranged in a display area of a substrate 100, first and second organic light-emitting diodes OLED1 and OLED2 respectively connected to the first and second pixel circuits PC1 and PC2, a composite layer 200 between the first and second pixel circuits PC1 and PC2, and the first and second organic light-emitting diodes OLED1 and OLED2. The composite layer 200 includes a first inorganic insulating layer 210, a first organic insulating layer 220, and a second inorganic insulating layer 230, which are sequentially stacked.

The display apparatus according to the illustrated embodiment further includes an inorganic material layer IL having an opening or a groove GR in an area between pixel circuits PC1 and PC2, and an organic material layer 161 may fill the opening or the groove GR. Also, a connection line 140 may be arranged on the organic material layer 161.

In an embodiment, a barrier layer 101, a buffer layer 111, a first gate insulating layer 112, a second gate insulating layer 113, and an interlayer insulating layer 115, which are arranged below the connection line 140 and include an inorganic material, may be collectively referred to as the inorganic material layer IL. The inorganic material layer IL has an opening or a groove GR in an area between neighboring pixel circuits.

FIG. 7 illustrates that the inorganic material layer IL has the groove GR. More particularly, the barrier layer 101 may be continuous across a first pixel circuit PC1 and a second pixel circuit PC2 of neighboring pixels. The buffer layer 111, the first gate insulating layer 112, the second gate insulating layer 113, and the interlayer insulating layer 115 may have openings 111a, 112a, 113a, and 115a in an area between the neighboring pixels, respectively.

As such, the barrier layer 101, the buffer layer 111, the first gate insulating layer 112, the second gate insulating layer 113, and the interlayer insulating layer 115 may have a groove GR in an area between the neighboring pixels, respectively. The groove GR may refer to a trench formed in the inorganic material layer IL.

The opening of the inorganic material layer IL may refer that openings are formed in each of the barrier layer 101, the buffer layer 111, the first gate insulating layer 112, the second gate insulating layer 113, and the interlayer insulating layer 115, such that the substrate 110 is exposed.

The inorganic material layer IL may include various different types of grooves in other embodiments. For example, a portion of the upper surface of the barrier layer 101 may also be removed, or the lower surface of the buffer layer 111 may be retained without being removed.

A width of the groove GR of the inorganic material layer IL may be several μm. For example, a width GRW of the groove GR of the inorganic material layer IL may have be in a range of about 5 μm to about 10 μm.

The opening or the groove GR may be formed by performing a separate mask process and an etching process on the interlayer insulating layer 115. The openings 111a, 112a, 113a, and 115a of the buffer layer 111, the first gate insulating layer 112, the second gate insulating layer 113, and the interlayer insulating layer 115 may be formed by the etching process. The etching process may be a dry etching process.

The groove GR of the inorganic insulating layer may be filled with an organic material layer 161. The connection line 140 is located above the organic material layer 161 where the organic material layer 161 is present. The opening or the groove GR of the inorganic material layer IL and the organic material layer 161 may be at least partially disposed between adjacent pixel circuits.

The openings or the grooves GR of the inorganic insulating layer and the organic material layer 161 may significantly reduce the influence of external impacts on the display apparatus. The inorganic insulating layer has the opening or the groove GR in the area between the pixel circuits, and the organic material layer 161 fills the opening or the groove GR. As such, even when there are external impacts, the probability of crack propagation becomes extremely low. In addition, since the organic material layer 161 has a hardness lower than that of the inorganic material layer, the organic material layer 161 absorbs stress caused by external impacts. Accordingly, stress concentration on the connection line 140 located on the organic material layer 161 may be significantly reduced in an effective manner.

The organic material layer 161 fills at least a portion of the groove GR of the inorganic insulating layer between the first pixel circuit PC1 and the second pixel circuit PC2. In some embodiments, the organic material layer 161 may not completely fill the groove GR, or may not fill a portion of the groove GR.

However, in order for the organic material layer 161 to absorb external impacts, the organic material layer 161 may completely fill the groove GR. In some embodiments, the organic material layer 161 may extend to the upper surface of the inorganic insulating layer. In this case, due to the characteristics of the organic material layer 161, the upper surface of the organic material layer 161 may have a convex shape. More particularly, a maximum height h of the organic material layer 161 may be greater than a depth d of the groove GR.

An angle between the upper surface of the organic material layer 161 and the upper surface of the inorganic material layer IL may be within 45°. When a slope of a boundary area where the upper surface of the inorganic insulating layer and the upper surface of the organic material layer 161 meet is not gentle, the conductive material may remain in a corresponding region without being removed from the boundary region during the process of forming the connection line 140 by patterning the conductive layer. In this case, the remaining conductive material may cause a short circuit between other conductive layers. Therefore, the upper surface of the organic material layer 161 may be formed to have a gentle slope with respect to the upper surface of the inorganic insulating layer.

The organic material layer 161 may include one or more materials selected from acryl, methacrylic, polyester, polyethylene, polypropylene, polyethylene terephthalate, polyethylene naphthalate, polycarbonate, polyimide, polyethylene sulfonate, polyoxymethylene, polyarylate, and hexamethyl disiloxane.

The connection line 140 may be arranged on the organic material layer 161 and configured to connect the first and second pixel circuits PC1 and PC2 to each other. The connection line 140 may also be located on the inorganic insulating layer in an area where the organic material layer 161 is not present. The connection line 140 may function as a wiring to transmit electrical signals to the first and second pixel circuits PC1 and PC2.

As the connection line 140 includes a material having high elongation, it is possible to prevent defects such as cracking or disconnection from occurring in the connection line 140. In some embodiments, the connection line 140 may have a stack structure of Ti/Al/Ti. In some embodiments, the elongation of the connection line 140 may be greater than the elongation of the conductive layers arranged thereunder.

Figure 8:
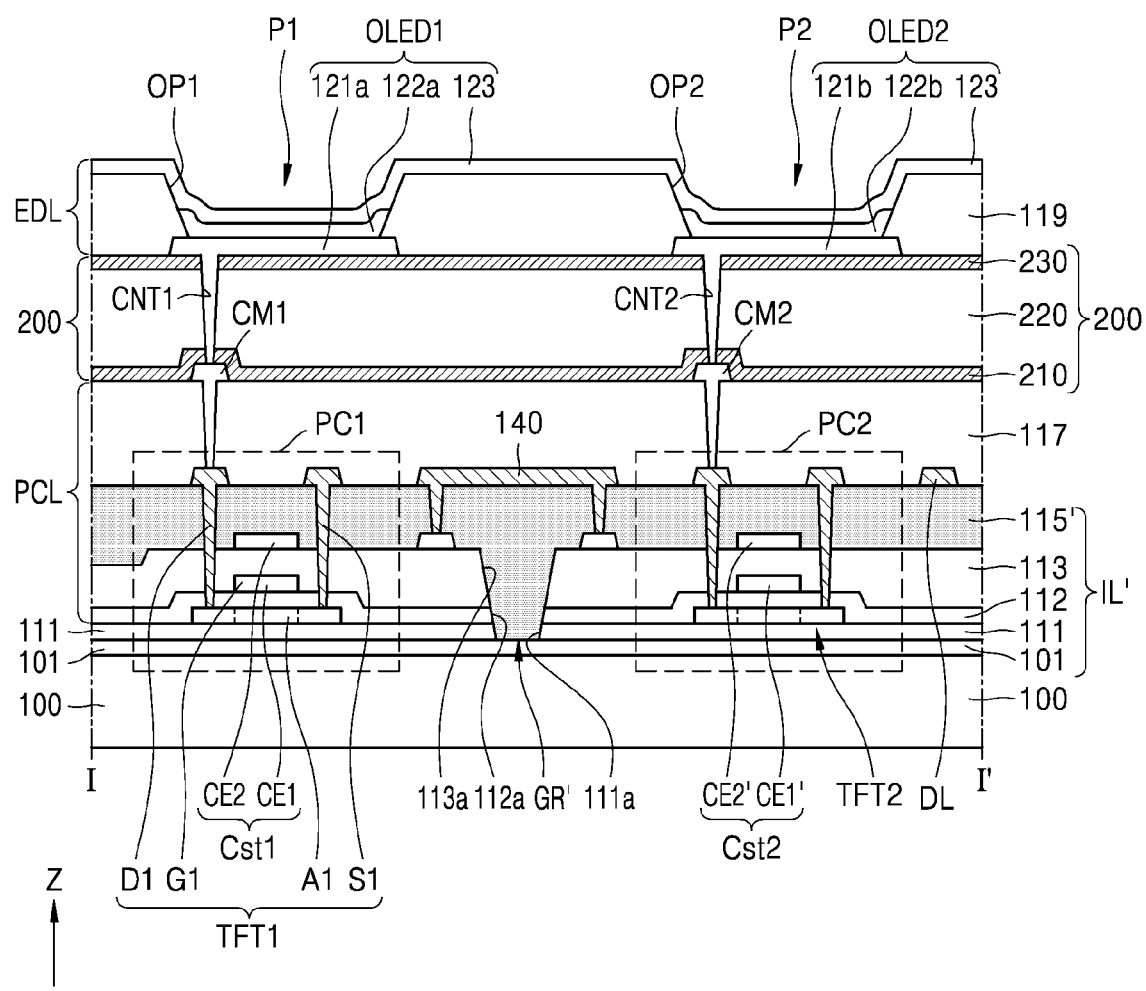
FIG. 8 is a schematic cross-sectional view of a portion of a display apparatus according to an embodiment.

FIG. 8 is a schematic cross-sectional view of a portion of a display apparatus according to an embodiment. In FIG. 8, the elements that are substantially the same as those in FIGS. 3 and 7 will be given the same reference numerals.

The display apparatus according to the illustrated embodiment includes first and second pixel circuits PC1 and PC2 arranged in a display area of a substrate 100, first and second organic light-emitting diodes OLED1 and OLED2 respectively connected to the first and second pixel circuits PC1 and PC2, a composite layer 200 between the first and second pixel circuits PC1 and PC2, and the first and second organic light-emitting diodes OLED1 and OLED2. The composite layer 200 includes a first inorganic insulating layer 210, a first organic insulating layer 220, and a second inorganic insulating layer 230, which are sequentially stacked.

The display apparatus according to the illustrated embodiment additionally includes an inorganic material layer IL' having an opening or a groove GR' in an area between the first and second pixel circuits PC1 and PC2, and an organic interlayer insulating layer 115' arranged on the front surface of the substrate 100 to fill the groove GR'.

In an embodiment, a barrier layer 101, a buffer layer 111, a first gate insulating layer 112, and a second gate insulating layer 113, which include an inorganic material, may be collectively referred to as an inorganic material layer IL'. The inorganic material layer IL' has an opening or a groove GR' in an area between neighboring pixel circuits.

FIG. 8 illustrates that the inorganic material layer IL' has the groove GR'. More particularly, the barrier layer 101 may be continuous across a first pixel circuit PC1 and a second pixel circuit PC2 of neighboring pixels. The buffer layer 111, the first gate insulating layer 112, and the second gate insulating layer 113 may have openings 111a, 112a, and 113a in an area between the neighboring pixels, respectively.

The opening of the inorganic material layer IL' may refer that openings are formed in each of the barrier layer 101, the buffer layer 111, the first gate insulating layer 112, and the second gate insulating layer 113, such that the upper surface of the substrate 100 is exposed. The inorganic material layer IL' may include various different types of grooves. For example, a portion of the upper surface of the barrier layer 101 may also be removed, or the lower surface of the buffer layer 111 may be retained without being removed.

The organic interlayer insulating layer 115' may cover storage capacitors Cst1 and Cst2 above the second gate insulating layer 113. Also, the organic interlayer insulating layer 115' may fill the groove GR' to prevent propagation of cracks.

The organic interlayer insulating layer 115' may include a general-purpose polymer (e.g., benzocyclobutene (BCB), polyimide, hexamethyldisiloxane (HMDSO), polymethylmethacrylate (PMMA), or polystyrene (PS)), a polymer derivative having a phenol-based group, an acrylic polymer, an imide-based polymer, an aryl ether-based polymer, an amide-based polymer, a fluorine-based polymer, a p-xylene-based polymer, or a vinyl alcohol-based polymer.

In the illustrated embodiment, the connection line 140 may be arranged on the organic interlayer insulating layer 115' and connect the first and second pixel circuits PC1 and PC2 to each other. When the organic interlayer insulating layer 115' provides a flat upper surface, the connection line 140 may also have a flat upper surface. The connection line 140 may function as a wiring to transmit electrical signals to the first and second pixel circuits PC1 and PC2.

Figure 9:
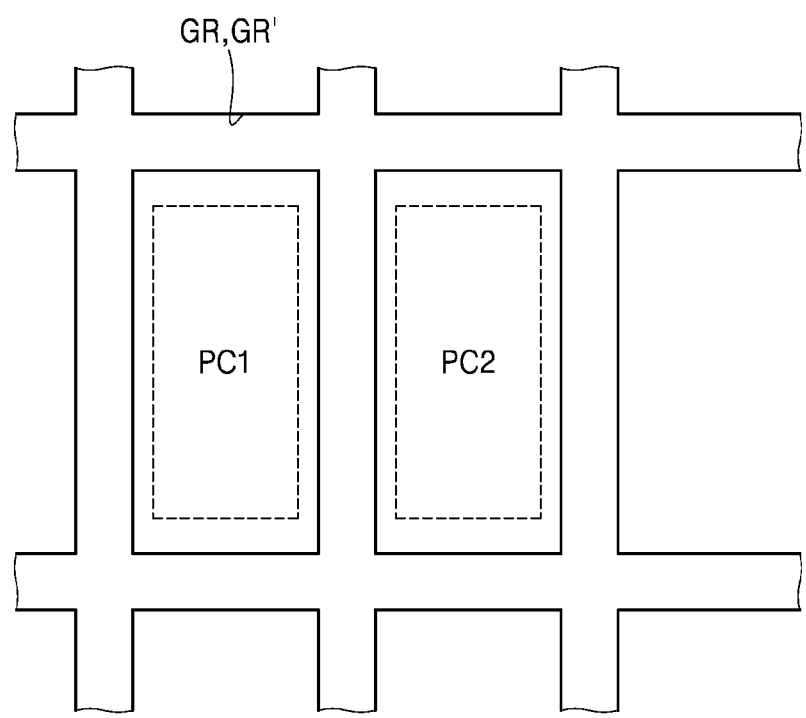
FIG. 9 is a plan view illustrating grooves shown in FIGS. 7 and 8 according to an embodiment.
Figure 10:
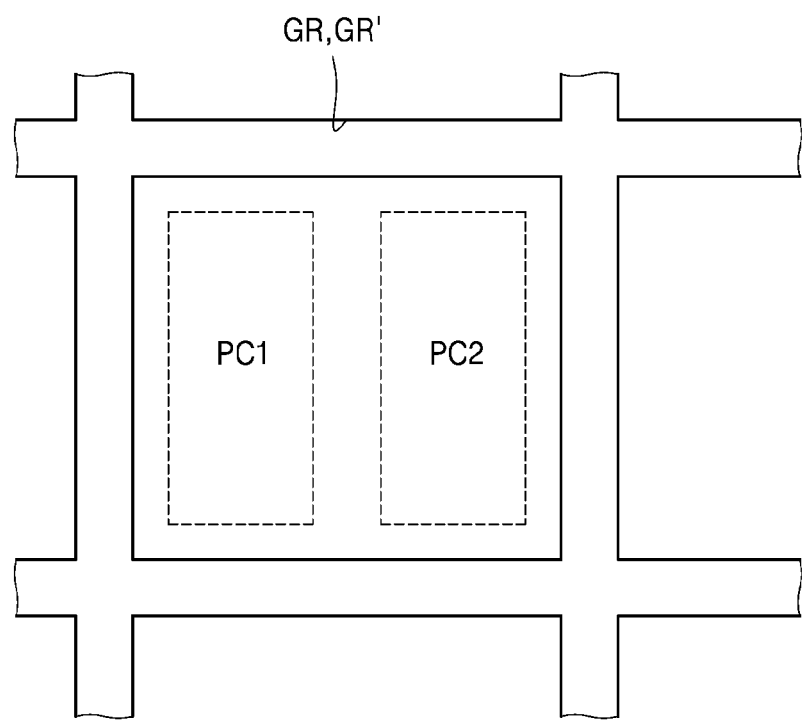
FIG. 10 is a plan view illustrating grooves shown in FIGS. 7 and 8 according to an embodiment.

FIGS. 9 and 10 are plan views illustrating grooves GR and GR' of FIG. 7 or 8 according to embodiments.

The openings or the grooves GR and GR' of the inorganic insulating layer may be arranged to at least partially surround the periphery of the pixel circuits. Referring to FIG. 9, the openings or the grooves GR and GR' of the inorganic insulating layer may be arranged to surround the periphery of the first pixel circuit PC1 and the second pixel circuit PC2. Alternatively, referring to FIG. 10, openings or grooves GR and GR' of an inorganic insulating layer may be arranged to surround a plurality of pixel circuits. For example, the openings or the grooves GR and GR' of the inorganic insulating layer are arranged to surround two pixel circuits, that is, a first pixel circuit PC1 and a second pixel circuit PC2, as shown in FIG. 10. The number of pixels grouped by the grooves GR and GR' may be variously changed in other embodiments.

The number of pixel circuits grouped by the grooves GR and GR' may be the same in one display apparatus, or may be changed according to positions. For example, the opening or the groove GR of the inorganic insulating layer may be arranged to surround one pixel circuit in an area where there is a high risk of cracking or stress, and may be arranged to surround a plurality of pixel circuits in other areas. Alternatively, the opening or the groove GR of the inorganic insulating layer may be partially formed in a display area.

Figure 11:
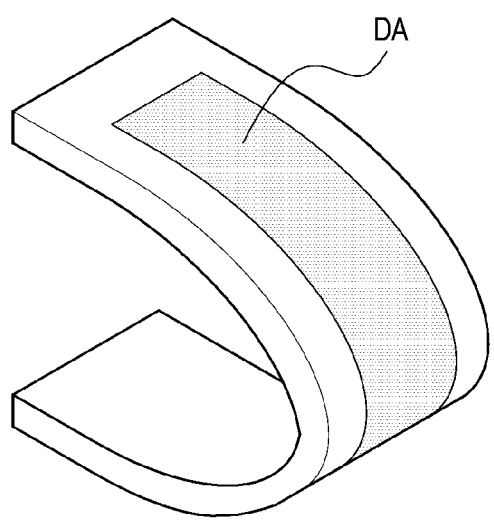
FIG. 11 is a schematic diagram of a display apparatus according to an embodiment.
Figure 12:
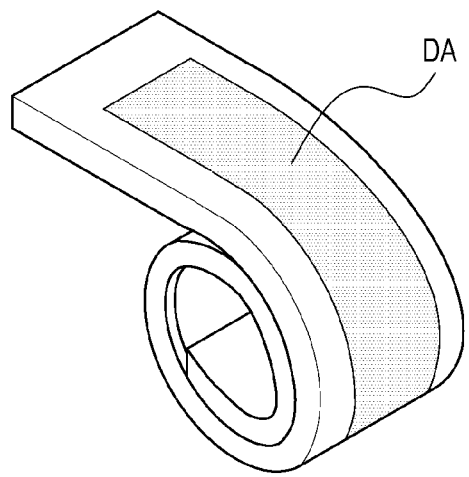
FIG. 12 is a schematic diagram of a display apparatus according to an embodiment.

FIGS. 11 and 12 are schematic diagrams of display apparatuses according to embodiments. FIG. 11 illustrates that a display area is folded, and FIG. 12 illustrates that a display area is rolled.

The display apparatuses according to embodiments are robust against external impacts, and thus, the display area DA may be foldable or rollable as shown in FIGS. 11 and 12.

More particularly, because a composite layer configured to distribute and absorb external impacts is between a pixel circuit and a display element, external impacts may be prevented or at least suppressed from being transmitted to the pixel circuit even when the display area DA is folded or rolled. Also, when the opening or the groove GR of the inorganic insulating layer is provided, an organic material layer or an organic interlayer insulating layer filling the groove GR may absorb tensile stress caused by bending.

Figure 13:
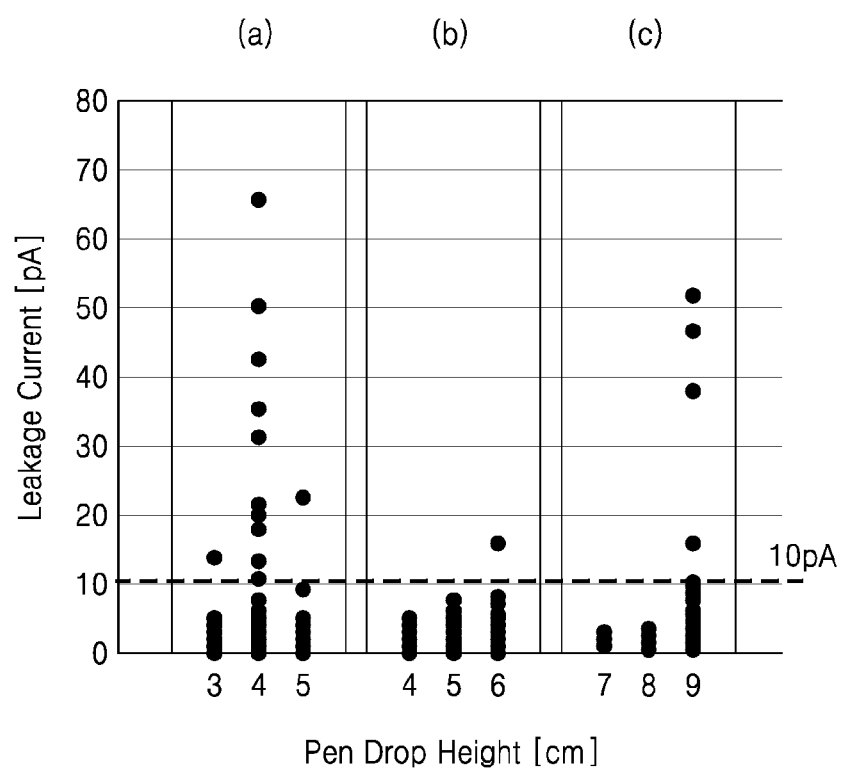
FIG. 13 illustrates a result of testing impact resistance of a display apparatus according to embodiments.

FIG. 13 illustrates a result of testing impact resistance of the display apparatus according to an embodiment. FIG. 13 shows data obtained by measuring a leakage current between the semiconductor layer and the gate electrode while a pen is dropped on the display area DA from a predetermined height.

(a) of FIG. 13 shows test data for a display apparatus of Comparative Example that does not include a composite layer or a groove in an inorganic insulating layer, (b) of FIG. 13 shows test data for a display apparatus that includes the composite layer of FIG. 3, and (c) of FIG. 13 shows test data for a display apparatus that includes a composite layer and a groove in an inorganic insulating layer as illustrated in FIG. 7.

In the case of Comparative Example as shown in (a) of FIG. 13, a leakage current of 10 pA or more occurred when the pen was dropped from a height of 3 cm or more, but in the case of (b) of FIG. 13, a leakage current of 10 pA or more does not occur even when the pen is dropped from a height of 5 cm. Also, in the case of (c) of FIG. 13, it can be confirmed that even when the pen is dropped from a height of 8 cm, a leakage current of 10 pA or more does not occur. As such, it can be confirmed that the display apparatus according to embodiment is robust against external impacts.

As described above, because the composite layer in which the first inorganic insulating layer, the first organic insulating layer, and the second inorganic insulating layer are stacked is between the pixel circuit and the display element, the display apparatuses according to embodiments may be robust against external impacts.

Also, because the display apparatuses according to the embodiments include the inorganic insulating layer having the opening or the groove in an area between the pixels, and the organic material layer filling the opening or the groove, the display apparatuses according to the embodiments may be flexible and robust against external impacts.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
   a substrate having a display area;
   a plurality of pixel circuits arranged in the display area, each of the pixel circuits including a thin-film transistor, the thin-film transistor including a semiconductor layer, a source electrode on the semiconductor layer, a drain electrode on the semiconductor layer, and a gate electrode on the semiconductor layer;
   a planarization layer comprising an organic material and covering the thin-film transistor, a top surface of the planarization layer being flat;
   a connection electrode directly disposed on the planarization layer, the connection electrode being directly connected to one of the source electrode or the drain electrode of the thin-film-transistor;
   a composite layer disposed on the connection electrode, the composite layer comprising a first inorganic insulating layer overlapping at least a semiconductor layer of one thin-film transistor, a first organic insulating layer overlapping the at least the semiconductor layer of the one thin-film transistor, and a second inorganic insulating layer overlapping the at least the semiconductor layer of the one thin-film transistor, the first inorganic insulating layer, the first organic layer, and the second inorganic insulating layer being sequentially stacked; and
   a plurality of display elements disposed on and above the composite layer, the plurality of display elements respectively connected to the pixel circuits with each display element including a pixel electrode and an emission layer on and directly over the pixel electrode,
   wherein the first inorganic insulating layer is directly disposed on the connection electrode and the planarization layer,
   the first inorganic insulating layer is thinner than the planarization layer.

2. The display apparatus of claim 1, wherein
   a thickness of each of the first inorganic insulating layer and the second inorganic insulating layer is in a range of about 1,000 Å to about 3,000 Å, and
   a thickness of the first organic insulating layer is in a range of about 10,000 Å to about 20,000 Å.

3. The display apparatus of claim 1, wherein
   a strength of each of the first inorganic insulating layer and the second inorganic insulating layer is in a range of about 80 GPa to about 200 GPa, and
   a strength of the first organic insulating layer is in a range of about 1 GPa to about 10 GPa.

4. The display apparatus of claim 1, wherein the composite layer further comprises a lower organic insulating layer disposed between the pixel circuit and the first inorganic insulating layer.

5. The display apparatus of claim 1, wherein the composite layer further comprises an upper organic insulating layer disposed between the second inorganic insulating layer and the display elements.

6. The display apparatus of claim 1, wherein the composite layer further comprises a second organic insulating layer and a third inorganic insulating layer, which are sequentially stacked over the second inorganic insulating layer.

7. The display apparatus of claim 1, further comprising:
   an inorganic material layer disposed under the planarization layer and including an opening or a groove in an area between the pixel circuits; and
   an organic material layer filling the opening or the groove.

8. The display apparatus of claim 7, wherein the opening or the groove surrounds each of the pixel circuits.

9. The display apparatus of claim 7, wherein the opening or the groove surrounds at least a portion of the pixel circuits.

10. The display apparatus of claim 1, further comprising:
    an inorganic material layer disposed provided in the display area and including an opening or a groove in an area between the pixel circuits; and
    an organic interlayer insulating layer disposed on substantially an entire display area and filling the opening or the groove.

11. A display apparatus comprising:
    a substrate comprising a display area and a peripheral area outside the display area;
    a circuit layer arranged in the display area of the substrate, the circuit layer comprising a first pixel circuit, a second pixel circuit, each pixel circuit including at least one thin-film transistor;
    a planarization layer comprising an organic material and covering the at least one thin-film transistor, a top surface of the planarization layer being flat;
    a connection electrode directly disposed on the planarization layer, the connection electrode being directly connected to the at least one thin film transistor;
    a composite layer disposed on the circuit layer, the composite layer comprising a first inorganic insulating layer overlapping at a semiconductor layer of least one thin-film transistor, a first organic insulating layer overlapping the semiconductor layer of the at least one thin-film transistor, and a second inorganic insulating layer overlapping the at least the semiconductor layer of one thin-film transistor, the first inorganic insulating layer, the first organic layer, and the second inorganic insulating layer being sequentially stacked; and
    a display element layer arranged on the composite layer, the display element layer comprising a first display element connected to the first pixel circuit and a second display element connected to the second pixel circuit, wherein
    the circuit layer further comprises an inorganic insulating material layer having an opening or a groove in an area between the first pixel circuit and the second pixel circuit which does not overlap the first pixel circuit and the second pixel circuit,
    wherein the first inorganic insulating layer is directly disposed on the connection electrode and the planarization layer,
    the first inorganic insulating layer is thinner than the planarization layer.

12. The display apparatus of claim 11, further comprising an organic material layer filling the opening or the groove and electrically isolated from the first pixel circuit and the second pixel circuit, wherein the planarization layer is disposed on the organic material layer.

13. The display apparatus of claim 12, further comprising a connection line arranged on the organic material layer to overlap the opening or the groove, wherein
    the connection line extends to an upper surface of the inorganic insulating material layer.

14. The display apparatus of claim 11, further comprising an organic interlayer insulating layer disposed over substantially an entire display area and filling the opening or the groove.

15. The display apparatus of claim 11, wherein the opening or the groove surrounds each of the first pixel circuit and the second pixel circuit in a plan view.

16. The display apparatus of claim 11, wherein the opening or the groove surrounds at least the first pixel circuit and the second pixel circuit together.

17. The display apparatus of claim 11, wherein the composite layer further comprises an additional organic insulating layer.

18. The display apparatus of claim 11, wherein
a thickness of each of the first inorganic insulating layer and the second inorganic insulating layer is in a range of about 1,000 Å to about 3,000 Å, and
a thickness of the first organic insulating layer is in a range of about 10,000 Å to about 20,000 Å.

19. The display apparatus of claim 11, wherein
a strength of each of the first inorganic insulating layer and the second inorganic insulating layer is in a range of about 80 GPa to about 200 GPa, and
a strength of the first organic insulating layer is in a range of about 1 GPa to about 10 GPa.

* * * * *